United States Patent [19]

Kielmeyer

[11] Patent Number: 4,977,379
[45] Date of Patent: Dec. 11, 1990

[54] DIFFERENTIAL PAIR, PUSH-PUSH OSCILLATOR

[75] Inventor: Ronald F. Kielmeyer, Chandle, Ariz.

[73] Assignee: Motorola, Inc., Schaumburg, Ill.

[21] Appl. No.: 373,557

[22] Filed: Jun. 30, 1989

[51] Int. Cl.$^5$ .............................................. H03B 1/00
[52] U.S. Cl. ................................. 331/56; 331/116 FE
[58] Field of Search ...................... 331/37, 38, 46, 56, 331/107 R, 107 P, 108 R, 116 FE

[56] References Cited

U.S. PATENT DOCUMENTS

| | | | |
|---|---|---|---|
| 4,378,534 | 3/1983 | Goedken et al. | 332/18 |
| 4,510,465 | 4/1985 | Rice et al. | 332/16 T |
| 4,587,497 | 5/1986 | Keller et al. | 331/116 R |
| 4,626,802 | 12/1986 | Gailus | 331/117 FE |
| 4,710,730 | 12/1987 | Doyle, III | 331/116 FE |
| 4,763,084 | 8/1988 | Pavio, Jr. et al. | 331/56 |
| 4,785,263 | 11/1988 | Kaltenecker | 331/117 FE |

Primary Examiner—Robert J. Pascal
Attorney, Agent, or Firm—Rolland R. Hackbart; Kenneth W. Bolvin

[57] ABSTRACT

A differential pair, push-push oscillator for generating clocking signals. This oscillator consists of two, single transistor oscillators that both oscillate at $f_o$ with a 180° phase difference. The phase difference is caused by the direct connection of the transistors' drains. A current source, connected to the transistors' drains, biases the transistors. The common drain connection also serves as an output for the differential pair, push-push oscillator. This output, a stable, relatively high power signal of frequency $2f_o$, is a composite of the two signals from the single transistor oscillators.

25 Claims, 1 Drawing Sheet

DIFFERENTIAL PAIR, PUSH-PUSH OSCILLATOR

TECHNICAL FIELD

This invention relates to a differential pair, push-push oscillator.

BACKGROUND OF INVENTION

Oscillators generate clocking signals in electronic circuits. The frequency of a signal generated by an oscillator can be either fixed at a certain value or controlled by another parameter such as a voltage.

Oscillators can be of various configurations, such as the push-push oscillator. In this configuration, 2 transistors are typically made to oscillate by the addition of other electronic elements. Each of the 2 oscillating circuits thus formed oscillate at the same frequency but with a 180° phase difference.

One example of such an oscillator scheme is illustrated in FIG. 1. Each of the 2 oscillators (G and H) is formed by a transistor (S), a varactor diode (X), and an inductor (C). The values of these elements are chosen such that each oscillator produces a signal of frequency $f_o$. An embedding element, such as a capacitor (A) or a dielectric resonator, is added between the transistors (S). If bipolar, npn transistors are used, the embedding element is connected between the emitters of the transistors. If MESFET's are used, the embedding element connects between the transistors' sources. This embedding element causes the 2 oscillators (G and H) to oscillate with a 180° phase difference thus causing the oscillator scheme to produce a signal of $2f_o$.

Another example of a prior art oscillator scheme is illustrated in FIG. 2. In this scheme, 2 oscillators (Y and Z), each formed by a transistor (R), a capacitor (O), and an inductor (T), oscillate at a frequency $f_o$. A d.c. connection is formed between the transistors by connecting the transistors' sources through the inductors (p). The common point between the inductors connects to a current source (U). The resulting output signal from this oscillator, with a frequency of $2f_o$, is the sum of the spurious signals from the 2 oscillating circuits (Y and Z).

These push-push oscillators, however, are not practical in certain applications because of their limited output power. Also, these schemes often allow the noise from the power supply to pass through to the output signal. In addition, the output signal of the second method will be unstable since it is the result of spurious oscillations and, therefore, there is no guarantee that the spurious oscillations will be present when required.

There exists a need, therefore, for a push-push oscillator having a stable output frequency, lower noise amplitude, and a higher power output.

SUMMARY OF THE INVENTION

This need and others are met through provision of the differential pair, push-push oscillator described in this specification. The oscillator includes 2 oscillators having outputs of the same frequency. These outputs are directly connected together and also to a current source.

The signals generated by the 2 oscillators are equal in frequency but are 180° out of phase. The 2 oscillators are forced to operate at a 180° phase difference because of the direct connection between them. The resulting output signal from the differential pair, push-push oscillator will be twice the frequency of either signal generated by the 2 oscillators. The output signal is a composite signal and not the summation of the 2 oscillators' spurious signals, therefore, the output will be a more stable signal. In addition, connecting the current source to the output of the 2 oscillators will create a relatively high power, low noise level output signal.

BEST MODE FOR CARRYING OUT THE INVENTION

Figure 1:
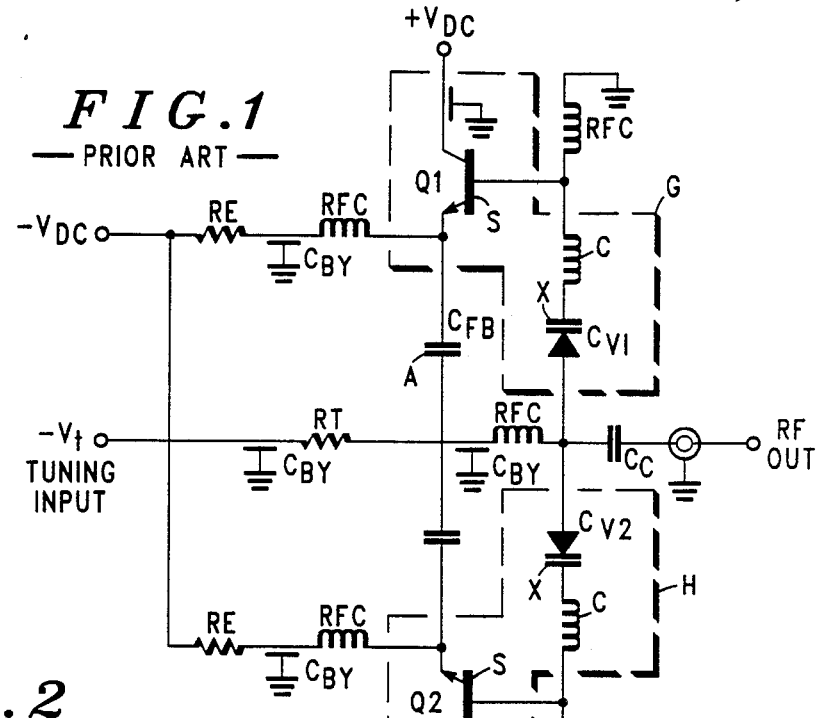
FIG. 1 is a schematic of a prior art, push-push oscillator
Figure 2:
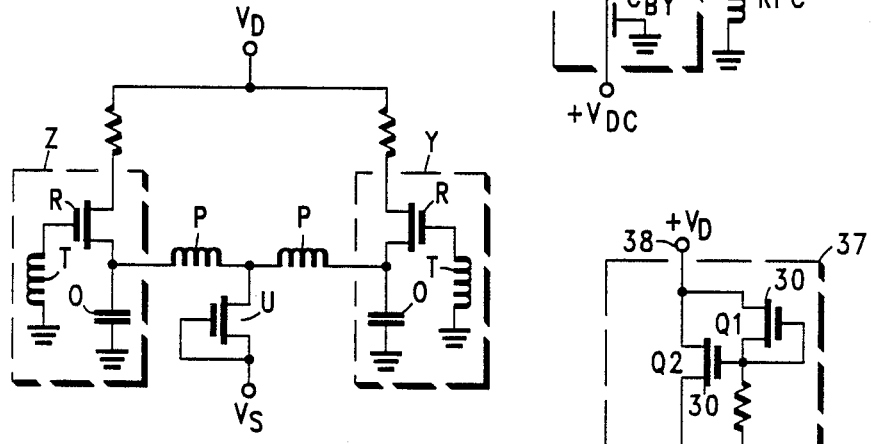
FIG. 2 is a schematic of a prior art, microwave push-push oscillator.
Figure 3:
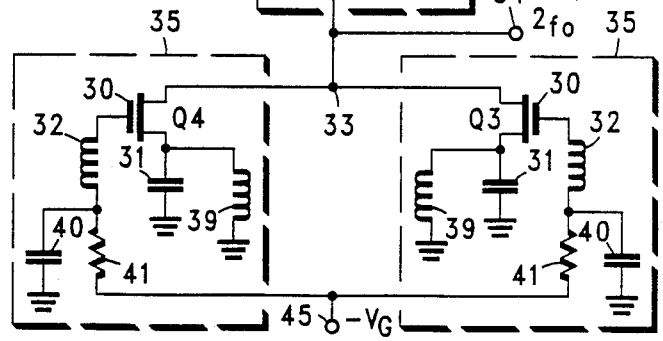
FIG. 3 is a schematic of a differential pair, push-push oscillator in accordance with this invention.

The differential pair, push-push oscillator, as illustrated in FIG. 3, is composed of MESFET transistors Q1-Q4 (30), capacitors (31 and 40), and inductors (32 and 39). A capacitor (31) to ground and an inductor (39) to ground connects to each of the sources of Q3 and Q4. An inductor (32) in series with a resistor (41) connects the gates of Q3 and Q4 to a negative power supply. A capacitor (40) to ground connects to the common node of the inductor/resistor series connection.

In addition, a d.c. connection is formed by the common connection of transistors Q3's and Q4's drains. This common drain node (33) connects to a current source (37) formed by the combination of transistors Q1 and Q2. The common drain node also serves as the output (34) of the differential pair, push-push oscillator.

The values of the inductors (32) connected to the transistor's gates and the capacitors (31) connected to the transistor's sources are chosen such that each of the 2 oscillators (35) formed by the transistor/inductor/capacitor combinations will oscillate at a frequency of $f_o$. The source inductors (39) act as very high impedances at $f_o$ to provide a d.c. path to ground for the transistor current. The gate capacitors (40) act as very low impedances at $f_o$ to provide an a.c. path to ground for the transistor current. The resistors (41) between the gate inductors (32) and the negative power supply (45) bias the gates of transistors Q3 and Q4 to $-V_G$. These resistors (41) are not required for proper operation of the oscillators (35) but are typically added to prevent inadvertent damage to the transistors.

The signals produced by the 2 oscillators (35) have equal frequencies but are forced 180° out of phase by the connection of the transistors' drains (33). The signal at the common drain output (34), therefore, has a frequency of $2f_o$. This $2f_o$ signal is a composite signal, as opposed to the prior art's summation signal, that is similar to a full-wave rectified sinewave. The composite signal is a more controlled, more stable signal than the prior art's summed spurious components.

The current source (37) operates in saturation and therefore keeps noise on the power supply line (38) from being converted to sideband noise at the frequency of the differential pair, push-push oscillator. This will reduce the noise amplitude on the output signal.

The differential pair, push-push oscillator described produces a composite signal of twice the frequency ($2f_o$) of the 2 oscillators that comprise the differential pair, push-push oscillator. The composite signal has better frequency stability and a higher power output than previous methods. In addition, the $2f_o$ signal produced by the differential pair, push-push oscillator has a lower noise amplitude.

I claim:

1. A differential pair, push-push oscillator comprising:
   (a) first transistor oscillator means having a terminal output for providing a first oscillating output signal $f_o$; and
   (b) second transistor oscillator means having a terminal output for providing a second oscillating output signal $f_o$;
   wherein the terminal outputs of the first and second oscillator means are directly connected together to maintain a substantially 180° phase difference between the first oscillating output signal and the second oscillating output signal.

2. The oscillator of claim 1 wherein the direct connection of the first and second transistor oscillator means forms an oscillator output providing an output signal having a frequency of $2f_o$.

3. The oscillator of claim 1 wherein the first and second oscillator means are biased by a current source.

4. The oscillator of claim 3 wherein the current source is operably coupled to the outputs of the first and second oscillator means.

5. The oscillator of claim 1 wherein the first and second oscillator means are each comprised of a transistor, a first and second capacitor, a first and second inductor and a resistor.

6. The oscillator of claim 5 wherein each transistor has a source, a drain, and a gate.

7. The oscillator of claim 6 wherein a first end of the first capacitor is operably coupled to the source of the transistor and a second end of the first capacitor is operably coupled to ground.

8. The oscillator of claim 6 wherein the first end of the first inductor is operably coupled to the gate of the transistor and a second end of the first inductor is operably coupled to a first end of the resistor.

9. The oscillator of claim 5 wherein a second end of the resistor is operably coupled to a means of supplying power.

10. The oscillator of claim 9 wherein the means of supplying power is a power supply that provides a negative voltage.

11. The oscillator of claim 6 wherein the outputs of the first and second oscillator means are the drains of the transistors.

12. The oscillator of claim 5 wherein the transistors are FET's.

13. The oscillator of claim 12 wherein the FET's are MESFET's.

14. A differential pair, push-push oscillator comprising:
   (a) first transistor oscillator means having an output for providing a first oscillating output signal $f_o$, the first oscillator means comprising a grounded first inductor operably coupled to a first transistor, a first end of a second inductor operably coupled to a first end of a first resistor at a first common node and a second end of a second inductor operably coupled to the first transistor, a grounded first capacitor operably coupled to the first transistor and a grounded second capacitor operably coupled to the first common node;
   (b) second transistor oscillator means having an output for providing a second oscillating output signal $f_o$, the second oscillator means comprising a grounded third inductor operably coupled to a second transistor, a first end of a fourth inductor operably coupled to a second resistor at a second common node and a second end of the fourth inductor operably coupled to the second transistor, a grounded third capacitor operably coupled to the second transistor and a grounded fourth capacitor operably coupled to the second common node; and
   (c) current sourcing means for biasing the first and second transistors, the current sourcing means operably coupled to the first and second transistors;
   wherein the outputs of the first and second transistor oscillator means are directly connected together, maintaining a substantially 180° phase difference between the first and second transistor oscillator means outputs and forming an output for the differential pair, push-push oscillator.

15. The differential pair, push-push oscillator of claim 12 wherein the first and second transistors have a gate, a source, and a drain.

16. The differential pair, push-push oscillator of claim 13 wherein the outputs of the first and second transistor oscillator means are the drains of the first and second transistors.

17. The differential pair, push-push oscillator of claim 13 wherein the grounded first inductor is operably coupled to the source of the first transistor.

18. The differential pair, push-push oscillator of claim 13 wherein the grounded first capacitor is operably coupled to the source of the first transistor.

19. The differential pair, push-push oscillator of claim 13 wherein the second end of the second inductor is operably coupled to the gate of the first transistor.

20. The differential pair, push-push oscillator of claim 13 wherein the grounded third inductor is operably coupled to the source of the second transistor.

21. The differential pair, push-push oscillator of claim 13 wherein the grounded third capacitor is operably coupled to the source of the second transistor.

22. The differential pair, push-push oscillator of claim 13 wherein the second end of the fourth inductor is operably, coupled to the gate of the first transistor.

23. The differential pair, push-push oscillator of claim 12 wherein the output of the differential pair, push-push oscillator provides a signal with frequency $2f_o$.

24. The differential pair, push-push oscillator of claim 12 wherein the transistors are FET's.

25. The differential pair, push-push oscillator of claim 20 wherein the FET's are MESFET's.

* * * * *